(12) United States Patent
Bedell et al.

(10) Patent No.: US 9,324,872 B2
(45) Date of Patent: Apr. 26, 2016

(54) BACK GATE SINGLE-CRYSTAL FLEXIBLE THIN FILM TRANSISTOR AND METHOD OF MAKING

(71) Applicant: INTERNATIONAL BUSINESS MACHINES CORPORATION, Armonk, NY (US)

(72) Inventors: Stephen W. Bedell, Wappingers Falls, NY (US); Bahman Hekmatshoartabari, White Plains, NY (US); Harold John Hovel, Katonah, NY (US); Ning Li, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/624,748

(22) Filed: Feb. 18, 2015

(65) Prior Publication Data

US 2015/0243796 A1    Aug. 27, 2015

Related U.S. Application Data

(60) Provisional application No. 61/945,421, filed on Feb. 27, 2014.

(51) Int. Cl.

| | |
|---|---|
| *H01L 27/12* | (2006.01) |
| *H01L 21/76* | (2006.01) |
| *H01L 29/786* | (2006.01) |
| *H01L 29/66* | (2006.01) |
| *H01L 29/417* | (2006.01) |

(52) U.S. Cl.
CPC .... *H01L 29/78654* (2013.01); *H01L 29/41733* (2013.01); *H01L 29/66772* (2013.01); *H01L 29/78603* (2013.01); *H01L 29/78606* (2013.01)

(58) Field of Classification Search
CPC ................ H01L 27/12; H01L 27/1203; H01L 21/76254; H01L 21/2011; H01L 21/76264
USPC ........................................ 257/352; 438/151
See application file for complete search history.

(56) References Cited

U.S. PATENT DOCUMENTS

| | | | |
|---|---|---|---|
| 8,445,965 B2 * | 5/2013 | Anderson ....... | H01L 21/823807 257/151 |
| 2010/0012917 A1 * | 1/2010 | Takaura ................... | G11C 8/08 257/4 |

OTHER PUBLICATIONS

Thornton, J et al., "Internal stresses in titanium, nickel, molybdenum, and tantalum films deposited by cylindrical magnetron sputtering", J. Vac. Sci. Technol., vol. 14 No. 1 (1977) pp. 164-168.

* cited by examiner

*Primary Examiner* — Monica D Harrison
(74) *Attorney, Agent, or Firm* — Scully, Scott, Murphy & Presser, P.C.; Louis J. Percello, Esq.

(57) ABSTRACT

A gate dielectric material and a gate conductor portion are formed on a single-crystal semiconductor material of a substrate. A dielectric structure is then formed surrounding the gate conductor portion and thereafter a stressor layer is formed on the dielectric structure. A controlled spalling process is then performed and thereafter a material removal process can be used to expose a surface of the single-crystal semiconductor material. A source region and a drain region are then formed on the exposed surface of the single-crystal semiconductor material, which exposed surface is opposite the surface including the gate dielectric.

20 Claims, 7 Drawing Sheets

BACK GATE SINGLE-CRYSTAL FLEXIBLE THIN FILM TRANSISTOR AND METHOD OF MAKING

RELATED APPLICATIONS

This application claims benefit of U.S. Provisional Application Ser. No. 61/945,421, filed on Feb. 27, 2014, the entire content of which is incorporated herein by reference.

BACKGROUND

The present application relates to a semiconductor structure and a method of forming the same. More particularly, the present application relates to a semiconductor structure including a back gate single-crystal flexible thin film transistor that is formed utilizing a controlled spalling process.

Mainstream thin film transistor (TFT) devices are comprised of amorphous or polycrystalline materials as the active channel materials, due to large area and low-cost processing compatible with low-cost substrates such as, for example, glass or flexible plastic. However, the performance of these devices (particularly mobility and therefore drive current and switching speed) is limited by the non-crystalline nature of the semiconductor active material. High performance devices may be achieved by crystalline semiconductors; however, the process of high performance crystalline transistors is on bulk semiconductor substrates; i.e., substrates that are entirely composed of one or more semiconductor materials.

Top gate thin film crystalline transistors made by controlled spalling has been previously proposed. Two aspects of these devices can be further improved. (1) In these top gate structures, gate dielectrics can be deposited on a spalled semiconductor surface. If thermal oxide needs to be used as the gate dielectric, it has to be done on the original semiconductor wafer surface by thermal oxidation. As such, this surface will be buried under the stressor layer after spalling. A stressor layer removal and spalled layer transfer process needs to be used to expose this channel surface for source/drain (S/D) formation after spalling. This process will subsequently enhance the complexity of TFT fabrication. (2) The top gate TFT has the gate and S/D regions on a same surface, which can result in complicated interconnect and wiring of a TFT array.

SUMMARY

A gate dielectric material and a gate conductor portion are formed on a single-crystal semiconductor material of a substrate. A dielectric structure is then formed surrounding the gate conductor portion and thereafter a stressor layer is formed on the dielectric structure. A controlled spalling process is then performed and thereafter a material removal process can be used to expose a surface of the single-crystal semiconductor material. A source region and a drain region are then formed on the exposed surface of the single-crystal semiconductor material, which exposed surface is opposite the surface including the gate dielectric.

In one aspect of the present application, a semiconductor structure, i.e., a back gate single-crystal thin film transistor, is provided. In one embodiment of the present application, the semiconductor structure includes a single-crystal semiconductor material layer comprising a first surface and a second surface opposite the first surface. A gate dielectric is located on the first surface and a gate conductor portion is located on a portion of the gate dielectric. A dielectric structure surrounds the gate conductor portion and contacts exposed portions of the gate dielectric. A stressor layer is located atop the dielectric structure. The semiconductor structure of the present application further includes a source region and a drain region located beneath the second surface of the single-crystal semiconductor material layer, wherein the drain region is spaced apart from the source region.

In another aspect of the present application, methods of forming a semiconductor structure, a back gate single-crystal thin film transistor, are provided. In one embodiment of the present application, the method includes providing a material stack of, from bottom to top, a base semiconductor substrate, an etch stop layer and a single-crystal semiconductor material layer, wherein a gate dielectric is present on a first surface of the single-crystal semiconductor material layer. Next, a gate conductor portion is formed on a surface of the gate dielectric and a dielectric structure is provided surrounding the gate conductor portion and contacting exposed portions of the gate dielectric. A stressor layer is then formed atop the dielectric structure. Next, a portion of the semiconductor base substrate is removed by utilizing a controlled spalling process. A remaining semiconductor material portion of the semiconductor base substrate and the etch stop layer are then removed to expose a second surface of the single-crystal semiconductor material that is opposite the first surface of the single-crystal semiconductor material. Next, a source region is formed on a first portion of the second surface of the single-crystal semiconductor material layer and a drain region is formed on a second portion of the second surface of the single-crystal semiconductor material layer.

In another embodiment of the present application, the method includes forming a gate dielectric on a first surface of a single-crystal bulk semiconductor substrate. Next, a gate conductor portion is formed on a surface of the gate dielectric, and a dielectric structure is provided surrounding the gate conductor portion and contacting exposed portions of the gate dielectric. A stressor layer is then formed atop the dielectric structure. Next, a portion of the single-crystalline bulk semiconductor substrate is removed by utilizing a controlled spalling process to provide a structure comprising a single-crystal semiconductor material layer having the first surface, and a second surface opposite the first surface, wherein the gate dielectric, the gate conductor portion, the dielectric structure and the stressor layer are located atop the first surface. Next, a source region is formed on a first portion of the second surface of the single-crystal semiconductor material layer and a drain region is formed on a second portion of the second surface of the single-crystal semiconductor material layer.

DESCRIPTION

Figure 1:
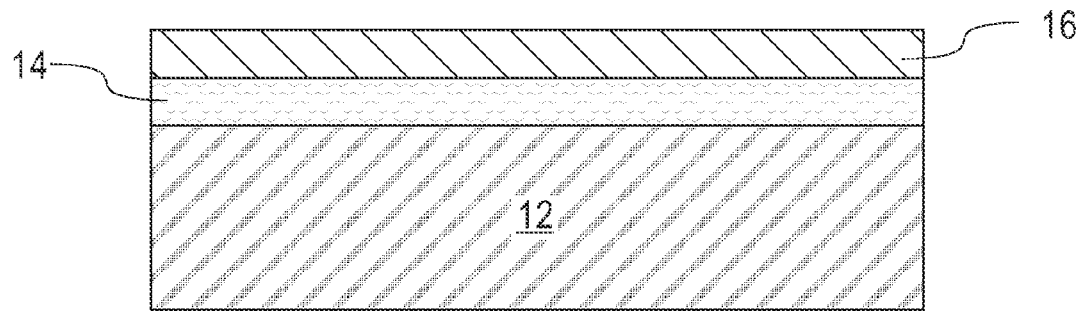
FIG. 1 is cross sectional view of an exemplary semiconductor structure including, from bottom to top, a base semiconductor substrate, an etch stop layer, and a single-crystal semiconductor material layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

In the present application, a controlled spalling process is used to remove a portion of a semiconductor material from a semiconductor base substrate. As used herein, a controlled spalling process is a layer transfer technology that uses mechanically guided fracture to separate a surface layer from a base substrate. The spalling process works by first forming a stressor layer, e.g., a Ni layer, atop a surface of the base substrate. A handle substrate can then be attached to the surface of the stressor layer. By using the handle layer to initiate and guide the fracture front that forms below the upper surface of the base substrate, a simple and robust layer transfer process can be achieved.

Referring first to FIG. 1, there is illustrated an exemplary semiconductor structure including, from bottom to top, a semiconductor base substrate 12, an etch stop layer 14, and a single-crystal semiconductor material layer 16 that can be employed in accordance with an embodiment of the present application. In one embodiment of the present application, the semiconductor base substrate 12, the etch stop layer 14, and the single-crystal semiconductor material layer 16 collectively constituent a semiconductor-on-insulator (SOI) substrate. In another embodiment, the semiconductor base substrate 12 is a bulk semiconductor substrate, and the etch stop layer 14 and the single-crystal semiconductor material layer 16 are layers that are disposed on the bulk semiconductor substrate. The term "bulk" denotes a semiconductor substrate that is entirely composed of at least one semiconductor material, i.e., single-crystal Si. In this embodiment and at this point of the present application, the single-crystal semiconductor material layer 16 has an exposed first surface and a second surface that is opposite the first surface that forms an interface with the etch stop layer 14.

The semiconductor base substrate 12 may be any semiconductor material whose fracture toughness is less than that of the stressor layer to be subsequently formed. Fracture toughness is a property which describes the ability of a material containing a crack to resist fracture. Fracture toughness is denoted $K_{Ic}$. The subscript IC denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero. Fracture toughness is a quantitative way of expressing a material's resistance to brittle fracture when a crack is present.

The term "semiconductor" as used throughout the present application denotes a material that has an electrical conductivity value between a conductor, such as copper, and an insulator such as, silicon dioxide. Examples of semiconductor materials that may provide the semiconductor base substrate 12 include, but are not limited to, Si, Ge, SiGe, SiC, SiGeC, and III/V compound semiconductors such as, for example, InAs, GaAs, or InP. Multilayers of these semiconductor materials can also be used as the semiconductor material that provides the semiconductor base substrate 12. In one embodiment, the semiconductor base substrate 12 is comprised of single-crystalline Si.

The semiconductor material that provides the semiconductor base substrate 12 may have {100}, {110}, or {111} crystallographic orientation. Other crystallographic orientations besides those specifically mentioned can also be used in the present application. In one embodiment, the semiconductor material that provides the semiconductor base substrate 12 may be a single-crystalline semiconductor material. In another embodiment, the semiconductor material that provides the semiconductor base substrate 12 may be polycrystalline material. In yet another embodiment of the present application, the semiconductor material that provides the semiconductor base substrate 12 may be an amorphous material.

In some embodiments of the present application (particularly, but not necessarily always, when the etch stop layer 14 is a component of an SOI substrate), the etch stop layer 14 may be an insulator. In such an embodiment, the insulator that provides the etch stop layer 14 may be a crystalline or non-crystalline oxide or nitride. In one embodiment, the insulator that provides the etch stop layer 14 is an oxide such as, for example, silicon dioxide.

In other embodiments of the present application (particularly, but not necessarily always, when the etch stop layer 14 is formed on a bulk semiconductor substrate), the etch stop layer 14 comprises a semiconductor material that has a different etch selectively than the underlying semiconductor material that provides semiconductor base substrate 12. For example and in one embodiment, the etch stop layer 14 may comprise a different semiconductor material than the underlying semiconductor material that provides semiconductor base substrate 12. In another example, the etch stop layer 14 may comprise a semiconductor material that is doped with a dopant (n-type or p-type), while the underlying semiconductor material that provides semiconductor base substrate 12 comprises a non-doped semiconductor material. As used throughout the present application, "p-type" refers to the addition of impurities to an intrinsic semiconductor material that creates deficiencies of valence electrons. As used throughout the present application, "n-type" refers to the addition of impurities that contributes free electrons to an intrinsic semiconductor.

In a further example, the etch stop layer 14 may comprise a semiconductor material of a first conductivity type (either n-type or p-type), while the underlying semiconductor material that provides semiconductor base substrate 12 comprises an opposite conductivity type than the etch stop layer 14. In yet an even further example, the etch stop layer 14 may comprise a semiconductor material of a first conductivity (n-type or p-type), while the underlying semiconductor material that provides semiconductor base substrate 12 comprises a same conductivity type dopant as the etch stop layer 14, but the concentration of dopants within each semiconductor material differs. In yet another embodiment of the present application, the etch stop layer 14 may comprise a porous semiconductor layer.

The single-crystal semiconductor material layer 16 may include one of the semiconductor materials mentioned above for the semiconductor base substrate 12. The term "single-crystal" is used throughout the present application to denote a semiconductor material in which the crystal lattice of the entire sample is continuous and unbroken to the edges of the sample, with no grain boundaries. In one embodiment of the present application, the single-crystal semiconductor material layer 16 and the semiconductor base substrate 12 comprise a same semiconductor material. In one example, the single-crystal semiconductor material layer 16 and the semiconductor base substrate 12 each comprises Si. In another embodiment of the present application, the single-crystal semiconductor material layer 16 comprises a different semiconductor material than the semiconductor base substrate 12. In one example, the single-crystal semiconductor material layer 16 comprises Si, while the semiconductor base substrate 12 comprises SiGe. In some embodiments, and as mentioned above, the single-crystal semiconductor material layer 16 may be a topmost surface of an SOI substrate. The single-crystal semiconductor material layer 16 may comprise a same or different crystallographic orientation as that of the semiconductor base substrate 12.

When the semiconductor base substrate 12, the etch stop layer 14, and the single-crystal semiconductor material layer 16 collectively constituent an SOI substrate, the SOI substrate may be formed utilizing standard processes including for example, SIMOX (separation by ion implantation of oxygen) or layer transfer. When a layer transfer process is employed, an optional thinning step may follow the bonding of two semiconductor wafers together.

In embodiments of the present application in which the semiconductor base substrate 12, the etch stop layer 14, and the single-crystal semiconductor material layer 16 do not collectively constituent an SOI substrate, the exemplary semiconductor structure shown in FIG. 1 can be formed by first providing the semiconductor base substrate 12. Next, the etch stop layer 14 is formed. In some embodiments, the etch stop layer 14 may be thermally grown on a surface of the semiconductor base substrate 10 utilizing a thermal oxidation and/or thermal nitridation process. In yet other embodiments, the etch stop layer 14 may be formed on the surface of the semiconductor base substrate utilizing a deposition process such as, for example, chemical vapor deposition (CVD), plasma enhanced chemical vapor deposition (PECVD), physical vapor deposition (PVD), or chemical solution deposition.

In some embodiments, an epitaxial deposition process can be used to form a semiconductor material that may provide the etch stop layer 14. In some embodiments, the epitaxial deposition, process may include an in-situ doping deposition process in which an n-type dopant or a p-type dopant is present in a reactant gas that may provide a doped semiconductor material as etch stop layer 14. In yet other embodiments, an epitaxial deposition process can be used to form a semiconductor material in which no dopants are present, and after epitaxial deposition dopants can be introduced into the epitaxial semiconductor material by ion implantation and/or gas phase doping.

In some embodiments, dopants (n-type of p-type) can be introduced into an upper semiconductor portion of the semiconductor base substrate 12 to provide the etch stop layer 14. In such an embodiment, the semiconductor base substrate 12 can be undoped or doped. Also, and in such an embodiment, the dopants can be introduced into the upper semiconductor portion of the base substrate 12 by ion implantation or gas phase doping.

In other embodiments, an anodization process as is well known to those skilled in the art can be used to convert an upper semiconductor portion of the semiconductor base substrate 12 into a porous semiconductor material which can serve as etch stop layer 14. In one example, the anodization process provides a porous Si material that can serve as etch stop layer 14.

In some embodiments of the present application, and when the single-crystal semiconductor material layer 16 is not a topmost surface of an SOI substrate, the single-crystal semiconductor material layer 16 may be formed utilizing a deposition process such as, for example, CVD or PECVD.

The thickness of the single-crystal semiconductor material layer 16 may vary. In one example, the thickness of the single-crystal semiconductor material layer 16 can be from 1 micrometer (i.e., μm or micron) or less. In another example, the thickness of the single-crystal semiconductor material layer 16 may be 500 nm or less. In yet another example, the thickness of the single-crystal semiconductor material layer 16 can be from 50 nm to 100 nm. In some embodiments, and when an ETSOI (extremely thin semiconductor-on-insulator) substrate is employed, the single-crystal semiconductor material layer 16 has a thickness of less than 10 nm. In one embodiment of the present application, the etch stop layer 14 that can be employed in the present application has a thickness from 1 nm to 200 nm. In another embodiment of the present application, the etch stop layer 14 can have a thickness from 100 nm to 150 nm. Other thicknesses that or lesser than or greater than the aforementioned thickness ranges may also be employed for the thickness of the etch stop layer 14. In one embodiment of the present application, the thickness of the semiconductor base substrate 12 is from 100 microns to 700 microns. In another embodiment of the present application, the thickness of the semiconductor base substrate 12 is from 500 microns to 2000 microns.

Figure 2:
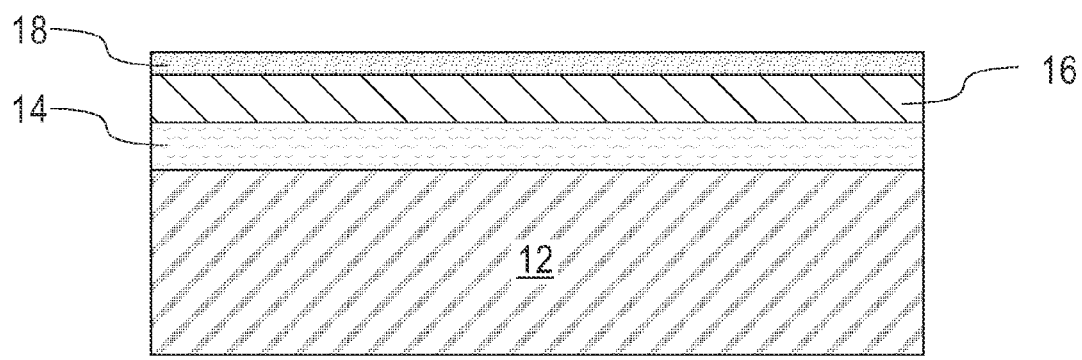
FIG. 2 is a cross sectional view of the exemplary semiconductor structure of FIG. 1 after forming a gate dielectric in accordance with an embodiment of the present application.

Referring now to FIG. 2, there is illustrated the exemplary semiconductor structure of FIG. 1 after forming a gate dielectric 18 on the first surface of the single-crystal semiconductor material layer 16 in accordance with an embodiment of the present application. As is shown, the gate dielectric 18 is a contiguous layer that spans the entirety of the first surface of the single-crystal semiconductor material layer 16. As is also shown, a lower portion of the gate dielectric 18 forms an interface with the first surface of the single-crystal semiconductor material layer 16.

In one embodiment of the present application, the gate dielectric 18 that can be used in the present application can be a semiconductor oxide, a semiconductor nitride, and/or a semiconductor oxynitride. In one example, the gate dielectric 18 can be composed of silicon dioxide, silicon nitride and/or silicon oxynitride. In another embodiment of the present application, the gate dielectric 18 may include at least a dielectric metal oxide. Exemplary dielectric metal oxides that can be used as gate dielectric 18 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a dielectric metal oxide can be formed and used as the gate dielectric 18. In one embodiment, the gate dielectric 18 is comprised of silicon dioxide that is prepared by a thermal process.

In some embodiments of the present application, the gate dielectric 18 can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the gate dielectric 18 can be formed by a thermal growth technique such as, for example, thermal oxidation and/or thermal nitridation. In yet a further embodiment of the present application, a combination of a deposition and thermal growth may be used in forming a multilayered gate dielectric structure which can be employed as gate dielectric 18.

In one embodiment of the present application, the gate dielectric 18 can have a thickness in a range from 1 nm to 10 nm. Other thicknesses that are lesser than or greater than the aforementioned thickness range can also be employed for the gate dielectric 18.

Figure 3:
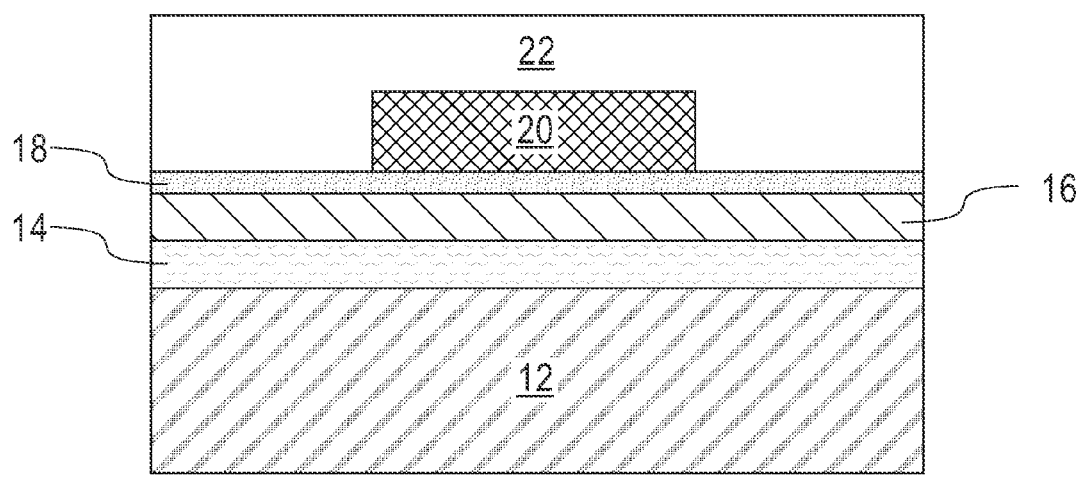
FIG. 3 is a cross sectional view of the exemplary semiconductor structure of FIG. 2 after formation of a gate conductor portion and a dielectric structure in accordance with an embodiment of the present application.

Referring now to FIG. 3, there is illustrated the exemplary semiconductor structure of FIG. 2 after formation of a gate conductor portion 20 and a dielectric structure 22 in accordance with an embodiment of the present application. As is shown, the gate conductor portion 20 is present on a portion of the gate dielectric 18. As is also shown, the dielectric structure 22 surrounds the gate conductor portion 20 and contacts exposed portions of the gate dielectric 18 that do not include the gate conductor portion 20.

The gate conductor portion 20 that can be used in the present application can be composed of any conductive material. For example, the conductive material that can provide the gate conductor portion 20 can be composed of doped polysilicon, doped silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof. In one embodiment, an entirety of the gate conductor portion 20 is comprised of a doped polysilicon or doped polysilicon germanium. In another embodiment, a lower portion of the gate conductor portion 20 is comprised a conductive material other than doped polysilicon or doped polysilicon germanium, and an upper portion of the gate conductor portion 20 is comprised of doped polysilicon or doped silicon germanium.

The conductive material that provides the gate conductor portion 20 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the conductive material that provides the gate conductor portion 20 has a thickness from 1 nm to 100 nm. Other thicknesses that are lesser than or greater than the aforementioned thickness range can also be employed for the conductive material that provides the gate conductor portion 20.

Following the deposition of the conductive material, the conductive material can be patterned to provide gate conductor portion 20. Patterning of the conductive material may include lithography and etching. Lithography can include forming a photoresist (not shown) on the topmost surface of conductive material exposing the photoresist to a desired pattern of radiation, and then developing the exposed photoresist with a resist developer to provide a patterned photoresist atop the conductive material. An etch is then employed which transfers the pattern from the patterned photoresist into the various materials. In one embodiment, the etch used for pattern transfer may include a dry etch process such as, for example, reactive ion etching, plasma etching, ion beam etching or laser ablation. In another embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern into the conductive material, the patterned photoresist can be removed utilizing a resist stripping process such as, for example, ashing. In some embodiments, the gate conductor portion 20 can be formed by a lift off process. Lift off is a method of creating structures (patterning) of a target material on the surface of a substrate using a sacrificial material. Lift off is an additive technique as opposed to more traditional subtracting technique like etching.

The dielectric structure 22 is then formed. Dielectric structure 22 has a topmost surface that is located above a topmost surface of the gate conductor portion 20. Dielectric structure 22 has first portions that contact sidewalls of the gate conductor portion 20, second portions that contact the topmost surface of the gate conductor portion 20, and third portions that contact exposed portions of the single-crystal semiconductor material layer 16 that are not covered by the gate conductor portion 20.

In some embodiments, the dielectric structure 22 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In one embodiment, the dielectric structure 22 can be formed utilizing a deposition process including, for example, chemical vapor deposition (CVD), plasma enhanced chemical vapor deposition (PECVD), evaporation or spin-on coating. The thickness of the dielectric structure 22 that can be employed in the present application may vary depending on the type of dielectric material employed as well as the method that was employed in forming the same. In one embodiment, the dielectric structure 22 has a thickness from 80 nm to 500 nm. Other thicknesses that are greater or lesser than the range provided above can also be used for the dielectric structure 22 so long as the dielectric structure 22 surrounds the gate conductor portion 20.

Figure 4:
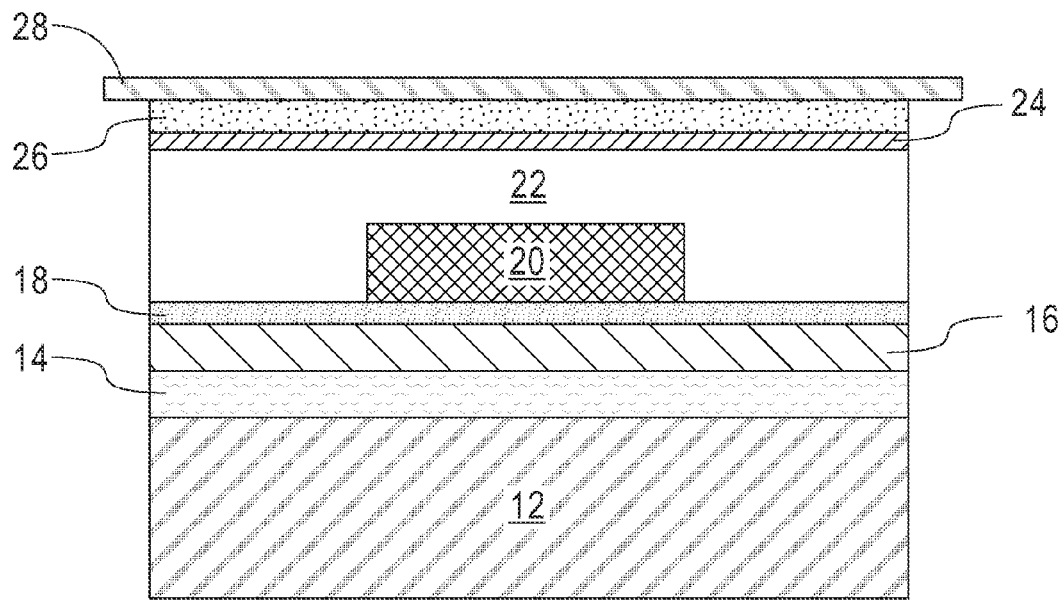
FIG. 4 is a cross sectional view of the exemplary semiconductor structure of FIG. 3 after formation of at least a stressor layer in accordance with an embodiment of the present application.

Referring now to FIG. 4, there is illustrated the exemplary semiconductor structure of FIG. 3 after formation of at least a stressor layer 26 in accordance with an embodiment of the present application. In some embodiments and as shown in the drawings, the stressor layer 26 can be disposed between a metal-containing adhesion layer 24 and a handle substrate 28. In other embodiments, the metal-containing adhesion layer 24 and/or the handle substrate 28 can be omitted. In some embodiments (not shown), a plating seed layer may be formed prior to forming the stressor layer 26. In yet other embodiments (not shown), an edge exclusion material can be formed on a surface of the dielectric structure 22 and at the outermost vertical edges of the dielectric structure 22. In embodiments in which an edge exclusion material is present, the edge exclusion material has one edge that is vertically coincident with an outermost vertical edge of dielectric structure 22, while another edge of the edge exclusion material is located inward from outermost vertical edge and on an exposed surface of the dielectric structure 22.

In one embodiment of the present application, the edge exclusion material can be an adhesion demoter. By "adhesion demoter" it is meant any material that reduces the ability of a subsequently formed metal-containing adhesion layer 24 or stressor layer 26 to adhere, i.e., stick, to the dielectric structure 22. The adhesion demoters that can be employed in the present application as the edge exclusion material include, but are not limited to, photoresist materials, polymers, hydrocarbon materials, inks, powders, pastes or non-adherent metals. In one embodiment, the adhesion demoter that can be employed in the present application as the edge exclusion material is an ink.

The photoresist materials that can be employed as the adhesion demoter include any well known positive-tone materials and/or negative-tone materials. The polymers that can be employed as the adhesion demoter include, but are not limited to, natural polymers such as rubbers, shellac, and cellulose, synthetic polymers such as nylon, polyethylene and polypropylene, deposited or applied in the form of tape or film. The hydrocarbon materials that can be employed as the adhesion demoter include, but are not limited to, saturated hydrocarbons (i.e., alkanes), unsaturated hydrocarbons (i.e., alkenes or alkynes), cycloalkanes, and/or aromatic hydrocarbons (i.e., arenes). Inks that can be employed as the adhesion demoter include, but are not limited to, alcohol or water-based inks commonly found in commercial permanent markers or inks used in bubble-jet printing technology. Non-adherent metals that can be employed as the adhesion demoter include, but are not limited to, Au, Ag, solders or low-melting point alloys. Pastes that can be employed as the adhesion demoter include, but are not limited to, metal based pastes, partially-cured epoxies, vacuum grease or similar materials.

The adhesion demoters that can be employed in the present application can be formed utilizing techniques that are well known in the art. For example, the adhesion demoters that can be employed in the present application as the edge exclusion material can be formed by chemical vapor deposition, plasma enhanced chemical vapor deposition, atomic layer deposition, spin-coating, brushing, spray coating, screen-printing, bubble-jet printing, or fabric-tip application. In some embodiments in which inks are employed as the adhesion demoters, the ink can be applied from a pen or marker containing the same. In one embodiment, the edge exclusion material has a width, which is determined from one sidewall edge to another sidewall edge, of from 0.01 mm to 10 mm. In another embodiment, the edge exclusion material has a width of from 0.1 mm to 5 mm. It is observed that a portion of materials (22, 18, 16, 14, and 12) that is located directly beneath the edge exclusion material defines an edge exclusion region whose presence minimizes edge related breakage during a subsequent spalling process. The term "edge exclusion region" is used throughout the present application to denote an area atop dielectric structure 22 in which a subsequently formed stressor layer is either not present or if, present, the stressor layer does not significantly adhere to the exposed surface of the dielectric structure 22.

The metal-containing adhesion layer 24 is employed in embodiments in which the stressor layer 26 to be subsequently formed has poor adhesion to dielectric structure 22. In some embodiments, the metal-containing adhesion layer 24 can be omitted. Typically, the metal-containing adhesion layer 24 is employed when a stressor layer 26 comprised of a metal is employed. In some embodiments, an optional plating seed layer (not shown) can be formed atop the exposed surface of the dielectric structure 22. The optional plating seed layer can be used together with the metal-containing adhesion layer 24 or in lieu thereof. When the optional plating seed layer is employed in conjunction with the edge exclusion material, the edge exclusion material is applied to the dielectric structure 22 prior to deposition of the plating seed layer.

The metal-containing adhesion layer 24 that can be employed in the present application includes any metal adhesion material such as, but not limited to, Ti/W, Ti, and Cr, Ni or any combination thereof. The metal-containing adhesion layer 24 may comprise a single layer or it may include a multilayered structure comprising at least two layers of different metal adhesion materials. When present, the metal-containing adhesion layer 24 can be formed at a temperature from 15° C. to 40° C., i.e., 288K to 313K, or above. In one embodiment, the metal-containing adhesion layer 24 can be formed at a temperature which is from 20° C. (293K) to 180° C. (353K). In another embodiment, the metal-containing adhesion layer 24 can be formed at a temperature which is from 20° C. (293K) to 60° C. (333K).

The metal-containing adhesion layer 24, which may be optionally employed, can be formed utilizing deposition techniques that are well known to those skilled in the art. For example, the metal-containing adhesion layer 24 can be formed by sputtering, chemical vapor deposition, plasma enhanced chemical vapor deposition, chemical solution deposition, physical vapor deposition, or plating. When sputter deposition is employed, the sputter deposition process may further include an in-situ sputter clean process before the deposition.

When employed, the metal-containing adhesion layer 24 typically has a thickness from 5 nm to 300 nm, with a thickness from 100 nm to 150 nm being more typical. Other thicknesses for the metal-containing adhesion layer 24 that are below and/or above the aforementioned thickness ranges can also be employed in the present application.

The optional plating seed layer (not shown) is typically employed in embodiments in which the stressor layer 26 to be subsequently formed is a metal and plating is used to form the metal-containing stressor layer. The optional plating seed layer is employed to selectively promote subsequent plating of a pre-selected metal-containing stressor layer. The optional plating seed layer may comprise, for example, a single layer of Ni or a layered structure of two or more metals such as Ti/Ni, Ti/Ag, Ti/Au, Cr/Ni, Cr/Ag, Cr/Au, Al(bottom)/Ti/Ni (top), etc. The thickness of the optional plating seed layer may vary depending on the material or materials of the optional plating seed layer as well as the technique used in forming the same. Typically, the optional plating seed layer has a thickness from 2 nm to 1 micron. The optional plating seed layer can be formed by a conventional deposition process including, for example, chemical vapor deposition (CVD), plasma-enhanced chemical vapor deposition (PECVD), atomic layer deposition (ALD), or physical vapor deposition (PVD) techniques that may include evaporation and/or sputtering.

In accordance with the present application, the metal-containing adhesion layer 24 and/or the optional plating seed layer is (are) formed at a temperature which does not effectuate spontaneous spalling to occur within semiconductor base substrate 12.

In some embodiments and as shown in FIG. 4, stressor layer 26 is formed on an upper surface of the metal-containing adhesion layer 24. In some embodiments in which the metal-containing adhesion layer 24 and edge exclusion material are not present, the stressor layer 26 can be formed directly on an exposed surface of dielectric structure 22; this particular embodiment is not shown in the drawings, but can readily be deduced from the drawings illustrated in the present application. In other embodiments in which an optional plating seed layer is employed, the stressor layer 26 can be formed directly on the upper surface of the optional plating seed layer; this particular embodiment is also not shown in the drawings, but can readily be deduced from the drawings illustrated in the present application.

The stressor layer 26 that can be employed in the present application includes any material that is under tensile stress on the dielectric structure 22 after deposition. The stressor layer 26 can also be referred to a stress inducing layer. In accordance with the present application, the stressor layer 26 has a critical thickness and a stress value that cause spalling mode fracture to occur within the semiconductor base substrate 12. In particular, the stressor layer 26 has a critical thickness in which spalling is initiated below the interface between etch stop layer 14 and the semiconductor base substrate 12 and somewhere within the semiconductor base substrate 12. By 'critical', it is meant that for a given stressor material and base substrate material combination, a thickness value and a stressor value for the stressor layer is chosen that render spalling mode fracture possible (can produce a $K_I$ value greater than the $K_{IC}$ of the substrate). The stress value can be adjusted by tuning the deposition conditions of the stressor layer 26. For example, in the case of sputter deposition of stressor layer 26, the gas pressure can be used to tune the stress value as described in Thorton and Hoffman, *J. Vac. Sci. Technol.*, 14 (1977) p. 164.

The thickness of the stressor layer 26 is chosen to provide the desired fracture depth somewhere within the semiconductor base substrate 12. For example, if the stressor layer 26 is chosen to be Ni, then fracture will occur at a depth below the stressor layer 26 roughly 2 to 3 times the Ni thickness. The stress value for the stressor layer 26 is then chosen to satisfy the critical condition for spalling mode fracture. This can be estimated by inverting the empirical equation given by $t^* = [(2.5 \times 10^6)(K_{IC}^{3/2})]/\sigma^2$, where $t^*$ is the critical stressor layer thickness (in microns), $K_{IC}$ is the fracture toughness (in units of MPa·m$^{1/2}$) of the semiconductor base substrate 12 and $\sigma$ is the stress value of the stressor layer (in MPa or megapascals). The above expression is a guide, in practice, spalling can occur at stress or thickness values up to 20% less than that predicted by the above expression.

Illustrative examples of such materials that are under tensile stress when applied atop dielectric structure 22 and thus can be employed as the stressor layer 26 include, but are not limited to, a metal, a polymer, such as a spall inducing tape layer, or any combination thereof. The stressor layer 26 may comprise a single stressor layer, or a multilayered stressor structure including at least two layers of different stressor material can be employed.

In one embodiment, the stressor layer 26 is a metal, and the metal is formed on an upper surface of the metal-containing adhesion layer 24. In another embodiment, the stressor layer 26 is a spall inducing tape, and the spall inducing tape is applied directly to the dielectric structure 22. In another embodiment, for example, the stressor layer 26 may comprise a two-part stressor layer including a lower part and an upper part. The upper part of the two-part stressor layer can be comprised of a spall inducing tape layer.

When a metal is employed as the stressor layer 26, the metal can include, for example, Ni, Cr, Fe, Mo, Ti or W. Alloys of these metals can also be employed. In one embodiment, the stressor layer 26 includes at least one layer consisting of Ni.

When a polymer is employed as the stressor layer 26, the polymer is a large macromolecule composed of repeating structural units. These subunits are typically connected by covalent chemical bonds. Illustrative examples of polymers that can be employed as the stressor layer 26 include, but are not limited to, polyimides polyesters, polyolefins, polyacrylates, polyurethane, polyvinyl acetate, or polyvinyl chloride.

When a spall inducing non-metallic layer (i.e. polymeric materials such as a tape) is employed as the stressor layer 26, the spall inducing layer includes any pressure sensitive tape that is flexible, soft, and stress free at a first temperature used to form the tape, yet strong, ductile and tensile at a second temperature used during removal, i.e., spalling of an upper portion of the semiconductor base substrate 12. By "pressure sensitive tape," it is meant an adhesive tape that will stick with application of pressure, without the need for solvent, heat, or water for activation. Tensile stress in the tape at the second temperature is primarily due to thermal expansion mismatch between the various materials shown in FIG. 3 (with a lower thermal coefficient of expansion) and the tape (with a higher thermal expansion coefficient).

Typically, the pressure sensitive tape that is employed in the present application as stressor layer 26 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 26 employed in the present application is formed at room temperature (15° C.-40° C., i.e., 288K-313K). In another embodiment, when a tape layer is employed, the tape layer can be formed at a temperature from 15° C. (288K) to 60° C. (333K).

When the stressor layer 26 is a metal or polymer, the stressor layer 26 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, or plating.

When the stressor layer 26 is a spall inducing tape layer, the tape layer can be applied by hand or by mechanical means to the structure. The spall inducing tape can be formed utilizing techniques well known in the art or they can be commercially purchased from any well known adhesive tape manufacturer. Some examples of spall inducing tapes that can be used in the present application as stressor layer 26 include, for example, Nitto Denko 3193MS thermal release tape, Kapton KPT-1, and Diversified Biotech's CLEAR-170 (acrylic adhesive, vinyl base).

In one embodiment, a two-part stressor layer can be formed on the dielectric structure 22, wherein a lower part of the two-part stressor layer is formed at a first temperature which is at room temperature or slight above (e.g., from 15° C. (288K) to 60° C. (333K)), wherein an upper part of the two-part stressor layer comprises a spall inducing tape layer at an auxiliary temperature which is at room temperature.

If the stressor layer 26 is of a metallic nature, it typically has a thickness of from 1 µm to 50 µm, with a thickness of from 4 µm to 7 µm being more typical. Other thicknesses for the stressor layer 26 that are below and/or above the aforementioned thickness ranges can also be employed in the present application.

If the stressor layer 26 is of a polymeric nature, it typically has a thickness of from 10 µm to 200 µm, with a thickness of from 50 µm to 100 µm being more typical. Other thicknesses for the stressor layer 26 that are below and/or above the aforementioned thickness ranges can also be employed in the present application.

In some embodiments, and as further shown in FIG. 4, a handle substrate 28 can be formed atop the stressor layer 26. In some embodiments of the present application, the handle substrate 28 can be omitted. When present, the handle substrate 28 can include any flexible material which has a minimum radius of curvature of less than 30 cm. Illustrative examples of flexible materials that can be employed as the handle substrate 28 include a metal foil or a polyimide foil.

The handle substrate 28 can be used to provide better fracture control and more versatility in handling the spalled portion of the semiconductor base substrate 12. Moreover, the handle substrate 28 can be used to guide the crack propagation during a subsequently performed spalling process. The handle substrate 28 of the present application is typically, but not necessarily, formed at a first temperature which is at room temperature (15° C. (288K)-40° C. (313K)).

The handle substrate 28 can be formed utilizing deposition techniques that are well known to those skilled in the art including, for example, mechanical pressure, dip coating, spin-coating, brush coating, sputtering, chemical vapor deposition, plasma enhanced chemical vapor deposition, chemical solution deposition, physical vapor deposition, or plating.

The handle substrate 28 typical has a thickness of from 5 µm to 500 µm, with a thickness of from 10 µm to 150 µm being more typical. Other thicknesses for the handle substrate 28 that are below and/or above the aforementioned thickness ranges can also be employed in the present application. As shown, the handle substrate 28 typically has a length that extends beyond the length of the various materials shown in FIG. 3.

Figure 5:
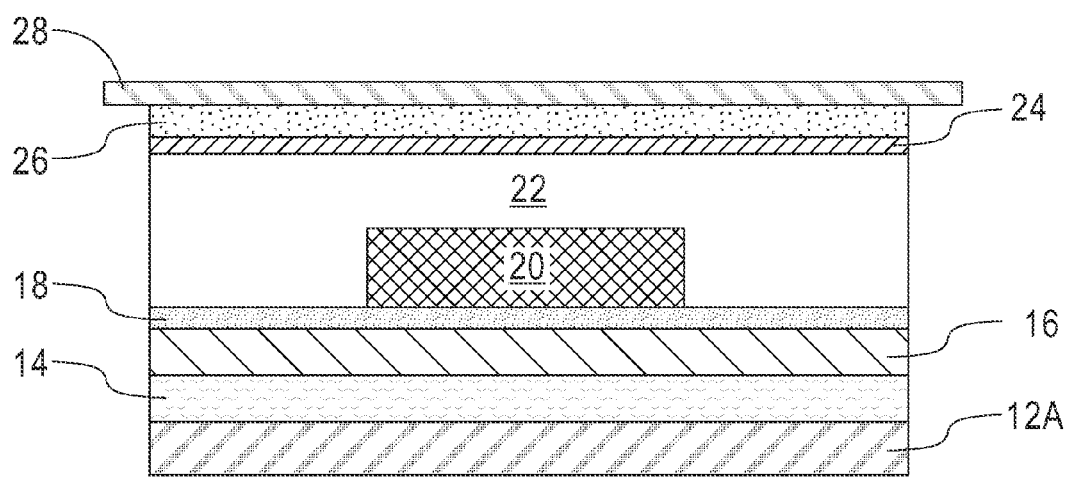
FIG. 5 is a cross sectional view of the exemplary semiconductor structure of FIG. 4 after removing a portion of the semiconductor base substrate utilizing a controlled spalling process.

Referring to FIG. 5, there is illustrated the exemplary semiconductor structure of FIG. 4 after removing a portion of the semiconductor base substrate 12 utilizing a controlled spalling process. In one embodiment of the present application, the spalling process includes pulling or peeling the handle substrate 28 to remove a thin film structure that includes at least the stressor layer 26, the dielectric structure 22, the gate conductor portion 20, the gate dielectric 18, the single-crystal semiconductor material layer 16, the etch stop layer 14 and an upper portion of the semiconductor base substrate 12. The upper portion of the single-crystalline semiconductor base substrate 12 that remains after spalling may be referred herein as a spalled semiconductor base portion 12A.

The spalling process includes crack formation and propagation within the semiconductor base substrate 12. The spalling process is initiated at substantially room temperature (i.e., 15° C. to 40° C.). In other embodiments, spalling can be performed at a temperature from 100° C. and below. In some embodiments of the present application, spalling can be initiated by lowering the temperature at a fixed continuous rate. By "fixed continuous rate" it is mean, for example, 20° C. per second utilizing an electronically controlled cooling table or chamber. This method of cooling allows one to reach a pre-specified temperature at which user-defined spalling initiation can induce a pre-determined spalling depth that may be different than that dictated by mere structural parameters (i.e., stressor layer stress and thickness, and fracture toughness of substrate).

The thickness of the spalled semiconductor base portion 12A that remains after spalling varies depending on the material of the stressor layer 26 and the semiconductor material of the semiconductor base substrate 12 itself. In one embodiment, the spalled semiconductor base portion 12A has a thickness of less than 100 microns. In another embodiment, the spalled semiconductor base portion 12A that is removed from the base substrate 10 has a thickness of less than 50 microns.

Figure 6:
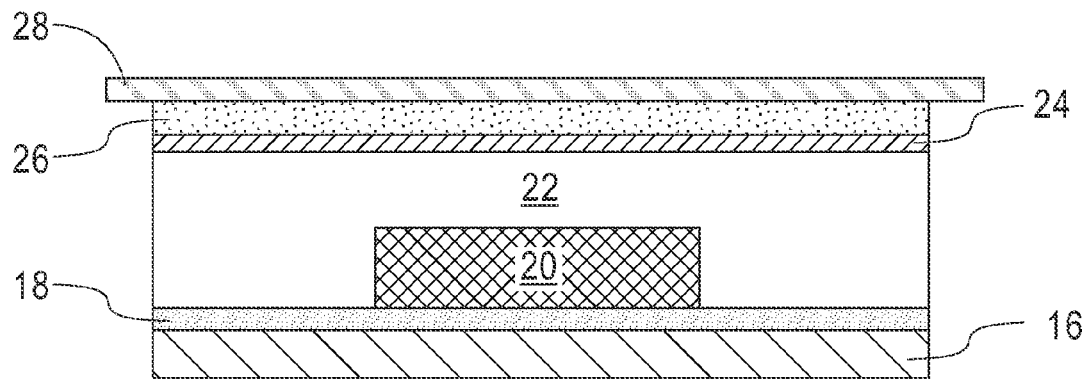
FIG. 6 is a cross sectional view of the exemplary semiconductor structure of FIG. 5 after exposing a surface of the single-crystal semiconductor material layer by removing a remaining portion of the semiconductor base substrate and the etch stop layer in accordance with an embodiment of the present application.

In some embodiments of the present application, various materials can be removed from above the dielectric structure 22 of the thin film structure shown in FIG. 6. In some embodiments of the present application, this step may be entirely omitted, or be performed at a later step of the present application. The various materials (i.e., any of the handle substrate 28, the stressor layer 26 the plating seed layer, the metal-containing adhesion layer 24, and the edge exclusion material) can be removed utilizing conventional techniques well known to those skilled in the art. For example, and in one embodiment, aqua regia ($HNO_3/HCl$) can be used for removing the handle substrate 28, the stressor layer 26, the plating seed layer, and the metal-containing adhesion layer 24. In another example, UV or heat treatment is used to remove the handle substrate 28 followed by a chemical etch to remove the stressor layer 26, followed by a different chemical etch to remove the plating seed layer, and/or the metal-containing adhesion layer 24. The edge exclusion material can be removed utilizing an organic solvent such, for example, as acetone.

Referring now to FIG. 6, there is illustrated the exemplary semiconductor structure of FIG. 5 after exposing a surface of the single-crystalline semiconductor layer 16 by removing a remaining portion of the semiconductor base substrate 12A and the etch stop layer 14 in accordance with an embodiment of the present application. The exposed surface of the single-crystal material semiconductor layer 16 may be referred to as the second surface of the single-crystal semiconductor material layer 16. As mentioned above, the second surface of the single-crystalline semiconductor material layer 16 is opposite the first surface of the single-crystalline semiconductor material that forms an interface with the gate dielectric 18 and further includes the gate conductor portion 20.

The removal of the remaining portion of the semiconductor base substrate 12A and the etch stop layer 14 can be performed utilizing at least one material removal process. Examples of material removal processes that can be used in the present application include, but are not limited to, chemical mechanical planarization, grinding, etching or any combination thereof. In some embodiments, the single-crystal semiconductor material layer 16 can be thinned at this point of the present application. Thinning may include a time etching process or thermal oxidation, followed by etching. Alternatively, the thinning may include an etch with an end point detection means. Thinning is employed in embodiments, in which the single-crystal semiconductor material layer 16 has a thickness than is greater than 100 nm.

Figure 7:
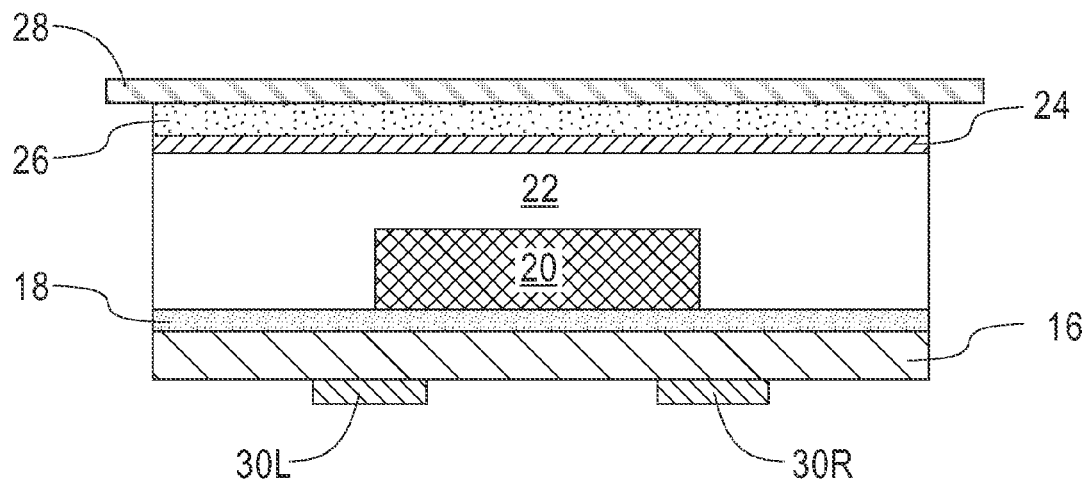
FIG. 7 is a cross sectional view of the exemplary semiconductor structure of FIG. 6 after formation of a source region and a drain region on an exposed surface of the single-crystal semiconductor material layer in accordance with an embodiment of the present application.

Referring now to FIG. 7, there is illustrated the exemplary semiconductor structure of FIG. 6 after formation of a source region 30L and a drain region 30R on an exposed surface, i.e., the second surface, of the single-crystal semiconductor material layer 16 in accordance with an embodiment of the present application. As is shown, the source region 30L and the drain region 30R are spaced apart from each other and each are located on an exposed surface, i.e., second surface, of the single-crystal semiconductor material layer 16. In some embodiments of the present application and as shown, at least a portion of source region 30L and at least a portion of the drain region 30R underlap beneath the gate conductor portion 20.

The source region 30L and the drain region 30R each comprises one of the conductive materials mentioned above for gate conductor portion 20. In some embodiments, the source region 30L includes a same conductive material as the drain region 30R. In other embodiments, the source region 30L comprises a different conductive material than the drain region 30L. Typically, the source region 30L and the drain region 30R each comprises an elemental metal such as tungsten, aluminum, nickel, ruthenium, palladium and platinum. In some embodiments of the present application, the source region 30L and the drain region 30R can be formed by a conventional lift off process. In some embodiments, the source region 30L and the drain region 30R can be formed by deposition, lithography and etching. In some instances, block mask technology may be utilized to provide different conductive materials for the source region 30L and the drain region 30R.

Figure 8:
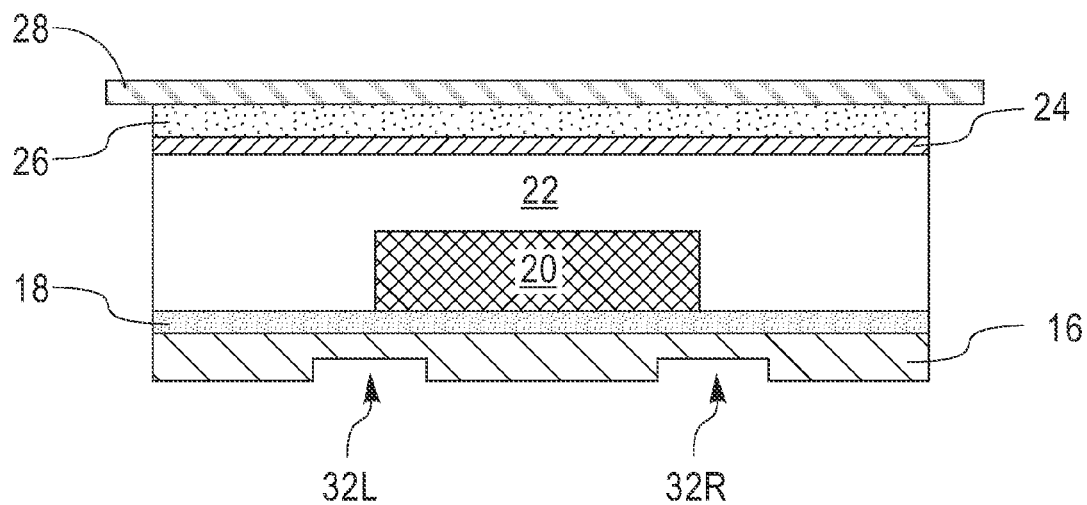
FIG. 8 is a cross sectional of the exemplary semiconductor structure of FIG. 6 after formation of a source opening and a drain opening in the single-crystal semiconductor material layer in accordance with an embodiment of the present application.

Referring to FIG. 8, there is illustrated the exemplary semiconductor structure of FIG. 6 after formation of a source opening 32L and a drain opening 32R in the single-crystal semiconductor material layer 16 in accordance with an embodiment of the present application. The source opening 32L and the drain opening 32R extend inward from the second surface of the single-crystal semiconductor material layer 16. The source opening 32L and the drain opening 32R can be formed by lithography and etching. The width and depth of the source opening 32L and the drain opening 32R can vary so long as the source opening 32L and the drain opening 32R do not contact each other or that the openings expose a surface of the gate dielectric 18.

Figure 9:
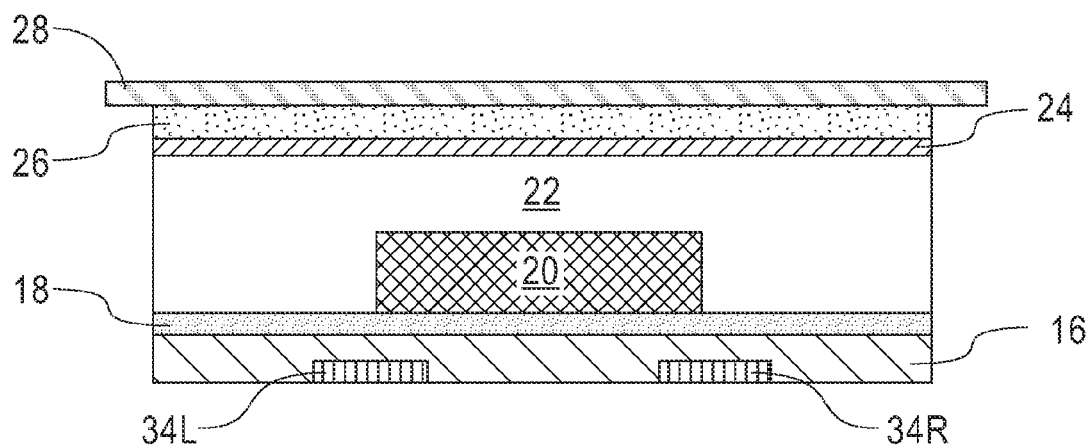
FIG. 9 is a cross sectional view of the exemplary semiconductor structure of FIG. 8 after formation of a source semiconductor material in the source opening and a drain semiconductor material in the drain opening in accordance with an embodiment of the present application.

Referring now to FIG. 9, there is illustrated the exemplary semiconductor structure of FIG. 8 after formation of a source semiconductor material 34L in the source opening 32L and a drain semiconductor material 34R in the drain opening 32R in accordance with an embodiment of the present application. The source semiconductor material 34L and the drain semiconductor material 34R comprise one of the semiconductors mentioned above for the base semiconductor substrate 12. In one embodiment of the present application, the source semiconductor material 34L and the drain semiconductor material 34R comprise a same semiconductor material as the single-crystal semiconductor material layer 16. In another embodiment of the present application, the source semiconductor material 34L and the drain semiconductor material 34R comprise a different semiconductor material than the single-crystal semiconductor material layer 16.

The source semiconductor material 34L and the drain semiconductor material 34R can be formed by a deposition process such as, for example, chemical vapor deposition or plasma enhanced chemical vapor deposition. A dopant (n-type or p-type) can be introduced during the deposition of the semiconductor material that provides the source semiconductor material 34L and the drain semiconductor material 34R. In some embodiments, a dopant can be introduced into the semiconductor material that provides the source semiconductor material 34L and the drain semiconductor material 34R after deposition of an intrinsic semiconductor material by ion implantation or gas phase doping.

In some embodiments, the source semiconductor material 34L and the drain semiconductor material 34R have a same crystalline characteristics as the semiconductor material of the deposition surface. In some embodiments (and as shown), the source semiconductor material 34L and the drain semiconductor material 34R have a surface that is coplanar with a bottommost surface of the single-crystal semiconductor material layer 16. In yet other embodiments, the source semiconductor material 34L and the drain semiconductor material 34R have a surface that is located above or below a bottommost surface of the single-crystal semiconductor material layer 16.

The source semiconductor material 34L and the drain semiconductor material 34R contain a semiconductor material and either a p-type dopant or an n-type dopant. The dopant concentration within the source semiconductor material 34L and the drain semiconductor material 34R can range from 10E17 to 10E21 atoms/cm$^3$.

Figure 10:
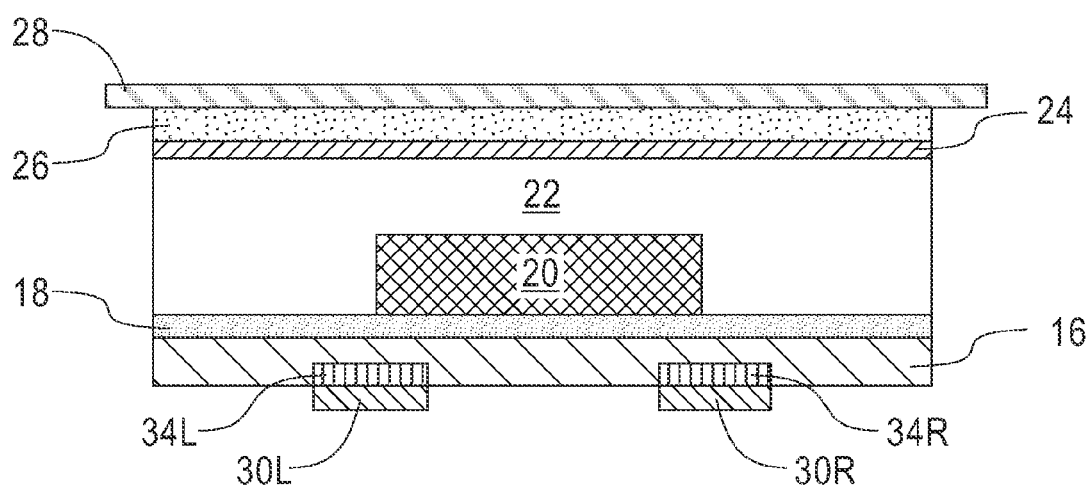
FIG. 10 is cross sectional view of the exemplary semiconductor structure of FIG. 9 after formation of source region on the source semiconductor material and a drain region on the drain semiconductor material in accordance with an embodiment of the present application.

Referring now to FIG. 10, there is illustrated the exemplary semiconductor structure of FIG. 9 after formation of source region 30L on the source semiconductor material 34L and a drain region 30R on the drain semiconductor material 34R in accordance with an embodiment of the present application. The source region 30L and the drain region 30R of this embodiment of the present application include one of the conductive materials mentioned above for the source region 30L and the drain region 30R in the embodiment that provides the structure shown in FIG. 7 of the present application. The source region 30L and the drain region 30R of this embodiment of the present application can be formed utilizing one of the processes mentioned above in forming the source region 30L and the drain region 30R in FIG. 7.

In some embodiments and as shown, the source region 30L is located only on a surface of the source semiconductor material 34L and the drain region 30L is located only on a surface of the drain semiconductor material 34R. In other embodiments (not shown), the source region 30L and/or the drain region 30R may extend onto a surface portion of the single-crystal semiconductor material layer 16.

Figure 11:
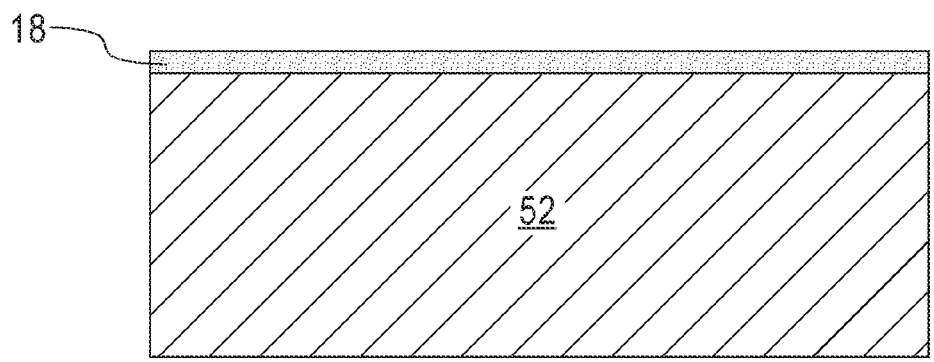
FIG. 11 is a cross sectional view of an exemplary semiconductor structure including a bulk semiconductor substrate and a gate dielectric that can be employed in accordance with another embodiment of the present application.

Referring now to FIG. 11, there is illustrated an exemplary semiconductor structure including a bulk semiconductor substrate 52 and a gate dielectric 18 that can be employed in accordance with another embodiment of the present application. The gate dielectric 18 is located on a first surface of the bulk semiconductor substrate 52.

In this embodiment of the present application, bulk semiconductor substrate 52 includes one of the semiconductor materials mentioned above for the base semiconductor substrate 10. The semiconductor material that provides the bulk semiconductor substrate 52 is single-crystal. In one example, the bulk semiconductor substrate 52 comprises single-crystal Si.

The gate dielectric 18 includes one of the insulator materials mentioned above in providing the structure shown in FIG. 2 of the present application. The gate dielectric 18 can be formed, and have a thickness, as mentioned above for providing the gate dielectric to the structure shown in FIG. 2.

Figure 12:
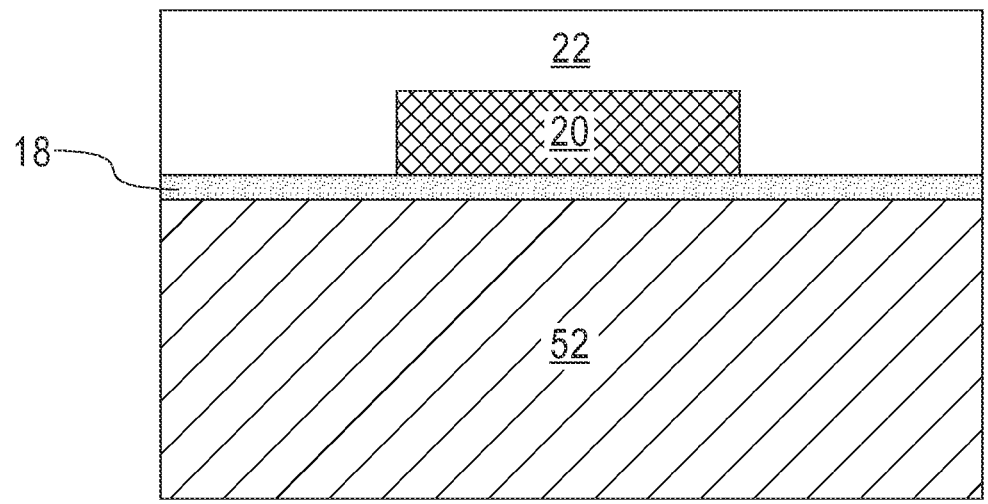
FIG. 12 is a cross sectional view of the exemplary semiconductor structure of FIG. 11 after formation of a gate conductor portion and a dielectric structure in accordance with an embodiment of the present application.

Referring now to FIG. 12, there is illustrated the exemplary semiconductor structure of FIG. 11 after formation of a gate conductor portion 20 and a dielectric structure 22 in accordance with an embodiment of the present application. The gate conductor portion 20 and the dielectric structure 22 of this embodiment of the present application are the same as described above in providing the structure shown in FIG. 3 of the present application.

Figure 13:
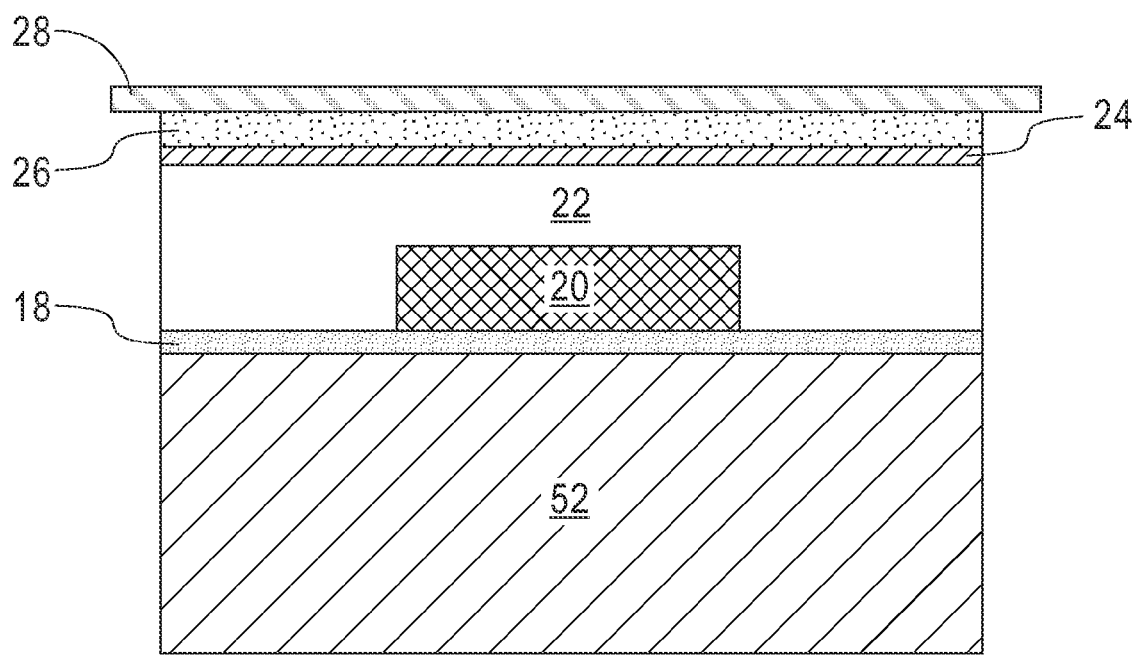
FIG. 13 is a cross sectional view of the exemplary semiconductor structure of FIG. 12 after formation of at least a stressor layer in accordance with an embodiment of the present application.

Referring now to FIG. 13, there is illustrated the exemplary semiconductor structure of FIG. 12 after formation of at least a stressor layer 26 in accordance with an embodiment of the present application. FIG. 13 also shows the presence of the metal-containing adhesion layer 24 and the handle substrate 28. In some embodiments, the metal-containing adhesion layer 24 and/or the handle substrate 28 may be omitted. In some embodiments, an edge exclusion material and/or a plating seed layer may also be employed. In this embodiment of the present application, the exclusion material, metal-containing adhesion layer 24, plating seed layer, stressor layer 26, and handle substrate 28 that are employed in this embodiment are the same as those mentioned above in describing the structure shown in FIG. 4 of the present application.

Figure 14:
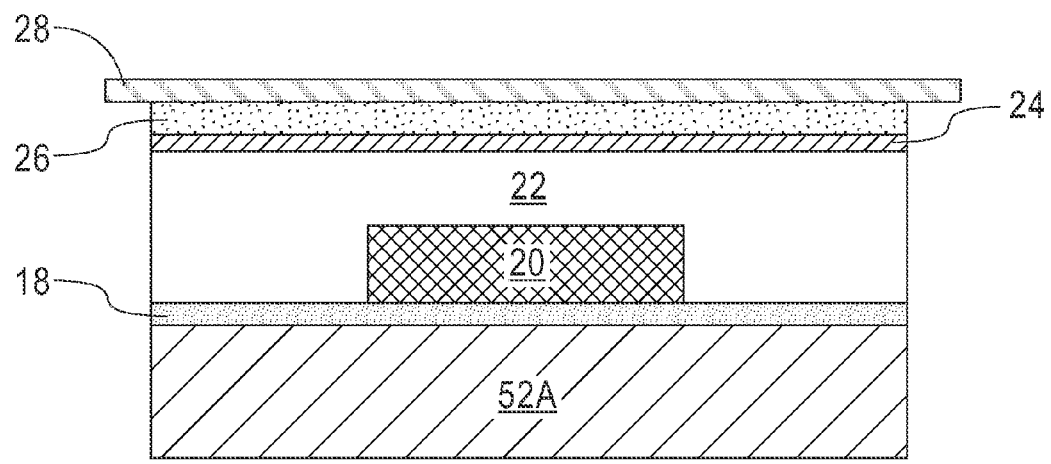
FIG. 14 is a cross sectional view of the exemplary semiconductor structure of FIG. 13 after removing a portion of the bulk semiconductor substrate to provide a single-crystal semiconductor material layer having a first surface containing the gate dielectric, the gate conductor portion, the dielectric structure, and the stressor layer in accordance with an embodiment of the present application.

Referring now to FIG. 14, there is illustrated the exemplary semiconductor structure of FIG. 13 after removing a portion of the bulk semiconductor substrate 52 to provide a thin film structure that includes a remaining portion of the bulk semiconductor substrate (hereinafter single-crystal semiconductor material layer 52A), gate dielectric layer 18, gate conductor portion 20, dielectric structure 22, and the stressor layer 26 in accordance with an embodiment of the present application. The metal-containing adhesion layer 24 and/or the handle substrate 28 may also be part of the thin film structure. In accordance with the present application, a controlled spalling process as mentioned above for providing the structure shown in FIG. 5 of the present application can also be used in this embodiment of the present application. The thickness of the single-crystal semiconductor material layer 52A that is provided by the controlled spalling process can vary and can be within the range mentioned above for the single-crystal semiconductor material layer 16. In one embodiment, the thickness of the single-crystal semiconductor material layer 52A can be 100 nm or less.

Figure 15:
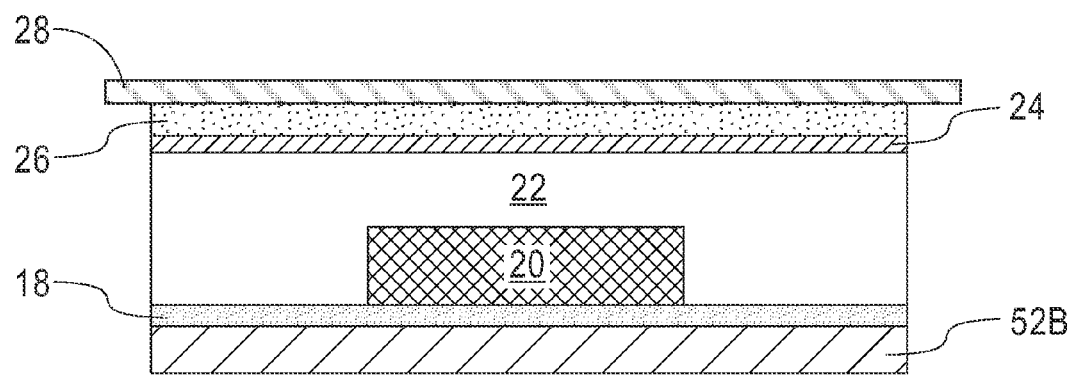
FIG. 15 is a cross sectional view of the exemplary semiconductor structure of FIG. 14 after thinning the single-crystal semiconductor material layer in accordance with an embodiment of the present application.

Referring now to FIG. 15, there is illustrated the exemplary semiconductor structure of FIG. 14 after thinning the single-crystal semiconductor material layer 52A in accordance with an embodiment of the present application. The thinned remaining portion of the single-crystal semiconductor material layer 52A can be referred to herein as single-crystal semiconductor material portion 52B. In one embodiment, single-crystal semiconductor material portion 52B can have a thickness that is 1 micrometer or less. In another embodiment, single-crystal semiconductor material portion 52B can have a thickness that is 500 nm or less. In a further embodiment, the single-crystal semiconductor material portion 52B can have a thickness from 10 nm to 100 nm. The thinning step may be performed utilizing a timed etching process or an etch with an end point detection can be used. In some embodiments, this step can be entirely omitted if the single-crystal semiconductor material layer 52A has a thickness that is 1 micrometer or less.

Figure 16:
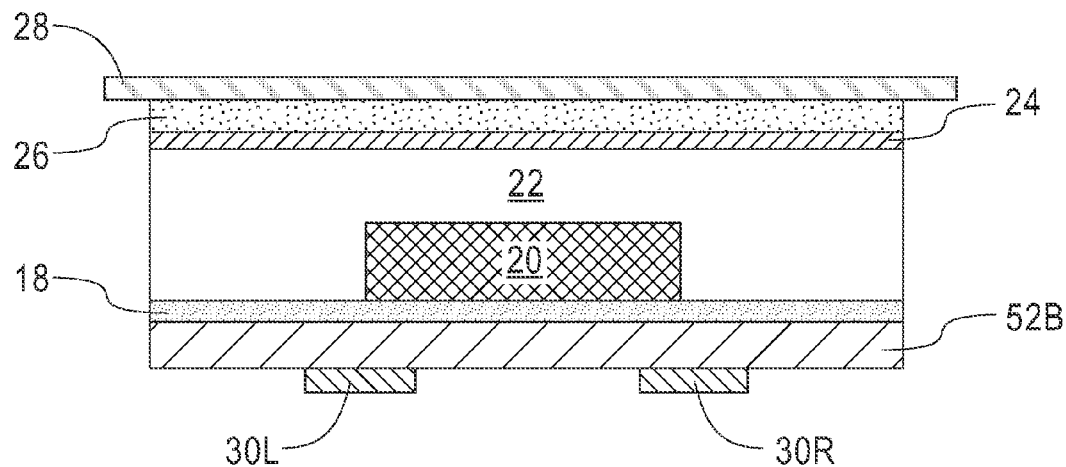
FIG. 16 is a cross sectional view of the exemplary semiconductor structure of FIG. 15 after formation of a source region and a drain region on a second surface of the thinned single-crystal semiconductor material layer which is opposite the first surface in accordance with an embodiment of the present application.

Referring now to FIG. 16, there is illustrated the exemplary semiconductor structure of FIG. 15 after formation of a source region 30R and a drain region 30L on an exposed surface, i.e., the second surface) of the single-crystal semiconductor material portion 52B in accordance with an embodiment of the present application. In some embodiments, and if the single-crystal semiconductor material layer 52A has a thickness of 100 nm or less, the source region 30R and the drain region 30L can be formed directly on an exposed surface, i.e., second surface, of the single-crystal semiconductor material layer 52A. The source region 30R and the drain region 30L of this embodiment of the present application are the same as that described above in providing the structure shown in FIG. 7 of the present application.

Figure 17:
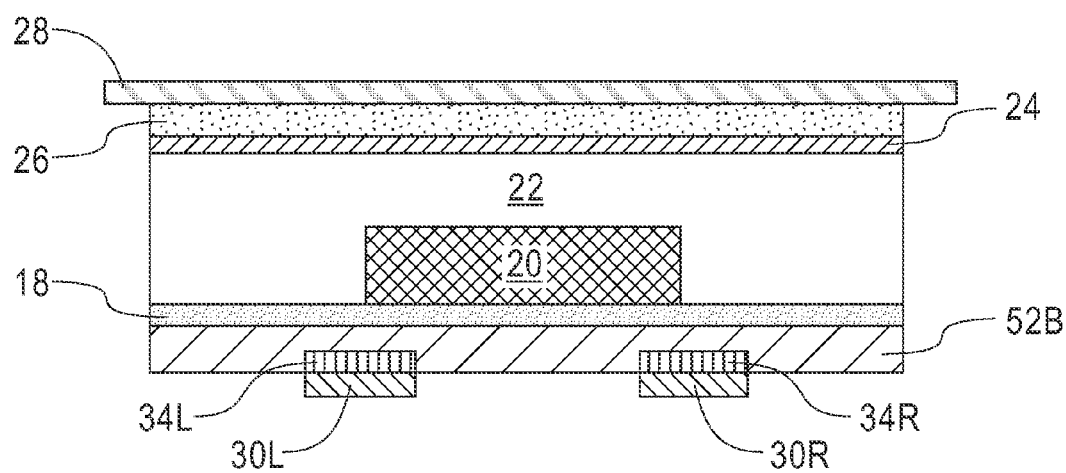
FIG. 17 is a cross sectional of the exemplary semiconductor structure of FIG. 15 after formation of a source region on a source semiconductor material and a drain region on a drain semiconductor material in accordance with an embodiment of the present application.

Referring now to FIG. 17, there is illustrated the exemplary semiconductor structure of FIG. 15 after formation of a source region 30L on a source semiconductor material 34L and a drain region on a drain semiconductor material in accordance with an embodiment of the present application. The structure shown in FIG. 17, including the source semiconductor material 34L, the drain semiconductor material 34R, the source region 30L and the drain region 30, comprises materials and processing steps mentioned above in providing the structures shown in FIGS. 8-10 of the present application.

The various methods of the present application described above provide a semiconductor structure, i.e., a back gate single-crystal thin film transistor. In one embodiment of the present application, the semiconductor structure includes a single-crystal semiconductor material layer (16, 52A, 52B) comprising a first surface and a second surface opposite the first surface. A gate dielectric 18 is located on the first surface and a gate conductor portion 20 is located on a portion of the gate dielectric 18. A dielectric structure 22 surrounds the gate conductor portion 20 and contacts exposed portions of the gate dielectric 18. A stressor layer 26 is located atop the dielectric structure 22. The semiconductor structure of the present application further includes a source region 30L and a drain region 30R located beneath the second surface of the single-crystal semiconductor material layer (16, 52A, 52B), wherein the drain region 30R is spaced apart from the source region 30L.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a single-crystal semiconductor material layer comprising a first surface and a second surface opposite said first surface, wherein said first surface is a topmost surface of said single-crystal semiconductor material layer and said second surface is a bottommost surface of said single-crystal semiconductor material layer;
    a gate dielectric located on said first surface of said single-crystal semiconductor material layer;
    a gate conductor portion located on a portion of said gate dielectric;
    a dielectric structure in physical contact with sidewall surfaces and a topmost surface of said gate conductor portion and contacting exposed portions of said gate dielectric;
    a stressor layer atop the dielectric structure; and
    a source region and a drain region located beneath and extending outward from said second surface of said single-crystal semiconductor material layer, wherein said drain region is spaced apart from said source region.

2. The semiconductor structure of claim 1, further comprising a metal-containing adhesion layer located interposed between said dielectric structure and said stressor layer.

3. The semiconductor structure of claim 2, further comprising a handle substrate located atop the stressor layer.

4. The semiconductor structure of claim 3, wherein said handle substrate extends beyond a length of each of said stressor layer, said metal-containing adhesion layer, said dielectric structure, said gate conductor portion, said gate dielectric and said single-crystal semiconductor material layer.

5. The semiconductor structure of claim 1, wherein said stressor layer is a metal.

6. The semiconductor structure of claim 1, further comprising a source semiconductor material located within a source opening formed in said single-crystal semiconductor material layer and a drain semiconductor material within a drain opening formed in said single-crystal semiconductor material layer, wherein said source region is located on said source semiconductor material and said drain region is located on said drain semiconductor material.

7. The semiconductor structure of claim 1, wherein a portion of said source region and a portion of said drain region underlap said gate conductor portion.

8. The semiconductor structure of claim 1, wherein said single-crystal semiconductor material layer comprises Si.

9. The semiconductor structure of claim 1, wherein said single-crystal semiconductor material layer has a thickness of 1 micrometer or less.

10. A method of forming a semiconductor structure, said method comprising:
    providing a material stack of, from bottom to top, a base semiconductor substrate, an etch stop layer and a single-crystal semiconductor material layer, wherein a gate dielectric is present on a first surface of said single-crystal semiconductor material layer;
    forming a gate conductor portion on a surface of said gate dielectric;
    providing a dielectric structure surrounding said gate conductor portion and contacting exposed portions of said gate dielectric;
    forming a stressor layer atop the dielectric structure;
    removing a portion of said semiconductor base substrate by utilizing a controlled spalling process;
    removing a remaining semiconductor material portion of said semiconductor base substrate and said etch stop layer to expose a second surface of said single-crystal semiconductor material layer that is opposite said first surface of said single-crystal semiconductor material layer; and
    forming a source region on a first portion of said second surface of said single-crystal semiconductor material layer and a drain region on a second portion of said second surface of said single-crystal semiconductor material layer.

11. The method of claim 10, further comprising forming a source semiconductor material within a source opening formed in said single-crystal semiconductor material layer and a drain semiconductor material within a drain opening formed in said single-crystal semiconductor material layer, prior to forming said source region and said drain region, and said source region is formed on said source semiconductor material and said drain region is formed on said drain semiconductor material.

12. The method of claim 11, further comprising forming a metal-containing adhesion layer between said dielectric insulation structure and said stressor layer.

13. The method of claim 11, further comprising forming a handle substrate atop the stressor layer prior to spalling, wherein said handle substrate extends beyond edges of said stressor layer, said dielectric structure, said gate conductor portion, said gate dielectric and said material stack.

14. The method of claim 13, wherein said controlled spalling process comprises pulling or peeling said handle substrate.

15. The method of claim 11, wherein said controlled spalling process is performed at room temperature.

16. A method of forming a semiconductor structure, said method comprising:
    forming a gate dielectric on a first surface of a single-crystalline bulk semiconductor substrate;
    forming a gate conductor portion on a surface of said gate dielectric;
    providing a dielectric structure surrounding said gate conductor portion and contacting exposed portions of said gate dielectric;
    forming a stressor layer atop the dielectric structure;
    removing a portion of said single-crystalline bulk semiconductor substrate by utilizing a controlled spalling process to provide a structure comprising a single-crystal semiconductor material layer having said first surface, and a second surface opposite said first surface, wherein said gate dielectric, said gate conductor portion, said dielectric structure and said stressor layer are located atop the first surface; and
    forming a source region on a first portion of said second surface of said single-crystal semiconductor material layer and a drain region on a second portion of said second surface of said single-crystal semiconductor material layer.

17. The method of claim 16, further comprising forming a source semiconductor material within a source opening formed in said single-crystal semiconductor material layer and a drain semiconductor material within a drain opening formed in said single-crystal semiconductor material layer, prior to forming said source region and said drain region, and said source region is formed on said source semiconductor material and said drain region is formed on said drain semiconductor material.

18. The method of claim 16, further comprising forming a metal-containing adhesion layer between said dielectric insulation structure and said stressor layer.

19. The method of claim 16, further comprising forming a handle substrate atop the stressor layer prior to spalling, wherein said handle substrate extends beyond edges of said stressor layer.

20. The method of claim 16, further comprising reducing a thickness of said single-crystal semiconductor material layer to a range from 1 micrometer or below prior to forming said source region and said drain region in said second surface.

* * * * *